United States Patent
Gans

(10) Patent No.: US 11,189,334 B2
(45) Date of Patent: *Nov. 30, 2021

(54) APPARATUSES AND METHODS FOR A MULTI-BIT DUTY CYCLE MONITOR

(71) Applicant: MICRON TECHNOLOGY, INC., Boise, ID (US)

(72) Inventor: Dean D. Gans, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/198,433

(22) Filed: Nov. 21, 2018

(65) Prior Publication Data

US 2020/0160902 A1    May 21, 2020

(51) Int. Cl.
*G11C 11/4076* (2006.01)
*H03K 5/156* (2006.01)

(52) U.S. Cl.
CPC ........ *G11C 11/4076* (2013.01); *H03K 5/1565* (2013.01)

(58) Field of Classification Search
CPC .......................... G11C 11/4076; H03K 5/1565
See application file for complete search history.

(56) References Cited

U.S. PATENT DOCUMENTS

| | | |
|---|---|---|
| 5,689,460 A | 11/1997 | Ooishi |
| 6,396,329 B1 | 5/2002 | Zerbe |
| 6,700,814 B1 | 3/2004 | Nahas et al. |
| 6,870,419 B1 | 3/2005 | Garrett, Jr. et al. |
| 7,414,445 B2 | 8/2008 | Heyne |
| 7,609,583 B2 | 10/2009 | Booth et al. |
| 7,990,802 B2 | 8/2011 | Booth et al. |
| 8,189,403 B2 | 5/2012 | Sohn et al. |

(Continued)

FOREIGN PATENT DOCUMENTS

| | | |
|---|---|---|
| KR | 20030045771 A | 6/2003 |
| KR | 20110003189 A | 1/2011 |

(Continued)

OTHER PUBLICATIONS

U.S. Appl. No. 16/198,493, titled "Apparatuses and Methods for Duty Cycle Adjustment of a Semiconductor Device", filed Nov. 21, 2018.

(Continued)

*Primary Examiner* — Sultana Begum
(74) *Attorney, Agent, or Firm* — Dorsey & Whitney LLP

(57) ABSTRACT

Embodiments of the disclosure are drawn to apparatuses and methods for a multi-bit duty cycle monitor. A clock signal may be provided to a memory in order to synchronize one or more operations of the memory. The clock signal may have a duty cycle which is adjusted by a duty cycle adjustor of the memory. The duty cycle of the adjusted clock signal may be monitored by a multi-bit duty cycle monitor. The multi-bit duty cycle monitor may provide a multi-bit signal which indicates if the duty cycle of the adjusted clock signal is above or below a target duty cycle value (or if the duty cycle is outside tolerances around the target duty cycle). The multi-bit duty cycle monitor may provide the multi-bit signal while access operations of the memory are occurring.

11 Claims, 5 Drawing Sheets

(56) References Cited

U.S. PATENT DOCUMENTS

| | | |
|---|---|---|
| 8,289,807 B2 | 10/2012 | Booth et al. |
| 9,202,561 B1 | 12/2015 | Park et al. |
| 9,263,107 B1 | 2/2016 | Wayland et al. |
| 9,449,687 B1 | 9/2016 | Piccardi et al. |
| 9,859,932 B2 | 1/2018 | Hwang |
| 10,249,354 B1 | 4/2019 | Lee et al. |
| 10,367,493 B1 | 7/2019 | Addepalli et al. |
| 10,529,398 B1 | 1/2020 | Lee et al. |
| 10,600,459 B2 | 3/2020 | Kim |
| 10,715,127 B2 * | 7/2020 | Gans ............... G11C 11/4076 |
| 10,783,940 B2 | 9/2020 | Kim |
| 10,902,897 B2 | 1/2021 | Kim |
| 11,003,370 B2 * | 5/2021 | Kim ............... G11C 11/4096 |
| 2003/0221044 A1 | 11/2003 | Nishio et al. |
| 2004/0243753 A1 | 12/2004 | Horowitz |
| 2006/0170453 A1 | 8/2006 | Zerbe et al. |
| 2007/0086267 A1 | 4/2007 | Kwak |
| 2007/0271052 A1 | 11/2007 | Abel et al. |
| 2008/0036509 A1 | 2/2008 | Jang |
| 2008/0159017 A1 | 7/2008 | Kim et al. |
| 2009/0125857 A1 | 5/2009 | Boerstler et al. |
| 2009/0140785 A1 | 6/2009 | Choi |
| 2010/0134153 A1 | 6/2010 | Zerbe et al. |
| 2011/0102039 A1 | 5/2011 | Shin |
| 2011/0228616 A1 | 9/2011 | Kim et al. |
| 2012/0086489 A1 | 4/2012 | Cherkassky et al. |
| 2012/0127214 A1 * | 5/2012 | Han ............... H05B 45/46 345/690 |
| 2012/0194244 A1 | 8/2012 | Kim et al. |
| 2012/0250426 A1 | 10/2012 | Huang |
| 2013/0051114 A1 | 2/2013 | Kim et al. |
| 2014/0253195 A1 | 9/2014 | Chandrasekaran et al. |
| 2014/0333361 A1 * | 11/2014 | Chau ............... H03K 3/017 327/175 |
| 2015/0097603 A1 | 4/2015 | Amirkhany et al. |
| 2015/0222254 A1 | 8/2015 | Walker |
| 2015/0364176 A1 | 12/2015 | Lee |
| 2016/0197485 A1 * | 7/2016 | Nirantare ............... H02J 5/005 307/104 |
| 2016/0211774 A1 * | 7/2016 | Degner ............... H02M 7/53875 |
| 2016/0261193 A1 * | 9/2016 | Karlsson ........... H02M 3/33569 |
| 2017/0140726 A1 | 5/2017 | Zhu et al. |
| 2017/0364276 A1 * | 12/2017 | Bhuiyan ............... G11C 7/222 |
| 2018/0350414 A1 | 12/2018 | Park et al. |
| 2018/0364752 A1 | 12/2018 | Li et al. |
| 2019/0081619 A1 | 3/2019 | Kim et al. |
| 2019/0188159 A1 * | 6/2019 | Song ............... G06F 13/4295 |
| 2019/0237127 A1 | 8/2019 | Moon et al. |
| 2019/0267056 A1 | 8/2019 | Lee et al. |
| 2019/0272804 A1 | 9/2019 | Amirkhany et al. |
| 2019/0371376 A1 | 12/2019 | Kim |
| 2019/0371377 A1 | 12/2019 | Kim |
| 2019/0371378 A1 | 12/2019 | Kim |
| 2019/0385654 A1 | 12/2019 | Lee et al. |
| 2020/0019345 A1 * | 1/2020 | Wang ............... G06F 3/0604 |
| 2020/0133505 A1 * | 4/2020 | Kim ............... G06F 3/0611 |
| 2020/0133542 A1 * | 4/2020 | Kim ............... G06F 3/0659 |
| 2020/0194044 A1 | 6/2020 | Kim |
| 2020/0336137 A1 | 10/2020 | Gans |
| 2020/0381029 A1 | 12/2020 | Kim |
| 2021/0027819 A1 | 1/2021 | Kim |

FOREIGN PATENT DOCUMENTS

| | | |
|---|---|---|
| KR | 20110097838 A | 8/2011 |
| WO | 2019125948 A1 | 6/2019 |
| WO | 2019164663 A1 | 8/2019 |
| WO | 2019231489 A1 | 12/2019 |

OTHER PUBLICATIONS

U.S. Appl. No. 16/167,303, titled "Apparatuses and Methods for Setting a Duty Cycle Adjuster for Improving Clock Duty Cycle", filed Oct. 22, 2018, pp. all.

U.S. Appl. No. 16/167,326, titled "Apparatuses and Methods for Setting a Duty Cycle Adjuster for Improving Clock Duty Cycle", filed Oct. 22, 2018, pp. all.

U.S. Appl. No. 16/167,340, titled "Apparatuses and Methods for Setting a Duty Cycle Adjuster for Improving Clock Duty Cycle" filed Oct. 22, 2018, pp. all.

U.S. Appl. No. 16/799,599, titled "Apparatuses and Methods for Setting a Duty Cycle Adjuster for Improving Clock Duty Cycle", dated Feb. 24, 2020, pp. all.

U.S. Appl. No. 16/995,568, titled "Apparatuses and Methods for Setting a Duty Cycle Adjuster for Improving Clock Duty Cycle" filed Aug. 17, 2020, pp. all.

U.S. Appl. No. 17/071,107 titled "Apparatuses and Methods for Setting a Duty Cycle Adjuster for Improving Clock Duty Cycle" filed Oct. 15, 2020, pp. all.

PCT Application No. PCT/US2018/065738 titled "Apparatuses and Methods for Duty Cycle Error Correction of Clock Signals" filed Dec. 14, 2018, pp. all.

PCT Application No. PCT/US2019/016528, titled "Apparatuses and Methods for Duty Cycle Distortion Correction of Clocks", filed Feb. 4, 2019, pp. all.

U.S. Appl. No. 15/903,934 entitled 'Apparatuses and Methods for Duty Cycle Distortion Correction of Clocks' filed on Feb. 23, 2018, pp. all.

U.S. Appl. No. 17/155,434 titled "Apparatuses and Methods for Setting a Duty Cycle Adjuster for Improving Clock Duty Cycle" filed Jan. 22, 2021, pp. all.

U.S. Appl. No. 17/202,553 titled "Apparatuses and Methods for Setting a Duty Cycle Adjuster for Improving Clock Duty Cycle" filed Mar. 16, 2021, pp. all.

U.S. Appl. No. 15/853,514, entitled 'Apparatuses and Methods for Duty Cycle Error Correction of Clock Signals', filed Dec. 22, 2017, pp. all.

U.S. Appl. No, 16/274,992, titled "Apparatuses and Methods for Duty Cycle Distortion Correction of Clocks" filed Feb. 13, 2019, pp. all.

U.S. Appl. No. 16/551,981 titled "Apparatuses and Methods for Duty Cycle Error Correction of Clock Signals" filed Aug. 27, 2019, pp. all.

Raja, Immanuel et al., "A 0.1-2-GHz Quadrature Correction Loop for Digital Multiphase Clock Generation Circuits in 130-nm CMOS", IEEE Transactions on Very Large Scale Integration (VLSI) Systems, vol. 25, Issue 3, Mar. 31, 2017., pp. 1-10.

U.S. Appl. No. 17/501,858 titled "Apparatuses and Methods for Duty Cycle Adjustment of a Semiconductor Device" filed Oct. 14, 2021, pp. all pages of application as filed.

* cited by examiner

APPARATUSES AND METHODS FOR A MULTI-BIT DUTY CYCLE MONITOR

BACKGROUND

Semiconductor devices may be used for a variety of applications, such as semiconductor memory devices used to store and retrieve information in computer systems. Clock signals may be provided to the semiconductor device (and/or generated by the semiconductor device) to synchronize the operation of various components to a common timing signal. It may be important to adjust the clock signals in order to achieve reliable operation of the semiconductor device.

The clock signal may have a duty cycle, which represents the percentage of time that the clock signal is in a certain state. For example the clock signal may alternate between a logical high level (e.g., a high voltage level) and a logical low level (e.g., a low voltage level). The duty cycle may be the percentage of time (in one period) that the signal is at the logical high level. The semiconductor device may adjust the duty cycle of the clock signal in order to ensure that the clock signal matches a desired duty cycle (e.g., 50%). However, it may be difficult to determine an amount by which to adjust the duty cycle in some scenarios.

DETAILED DESCRIPTION

Figure 1:
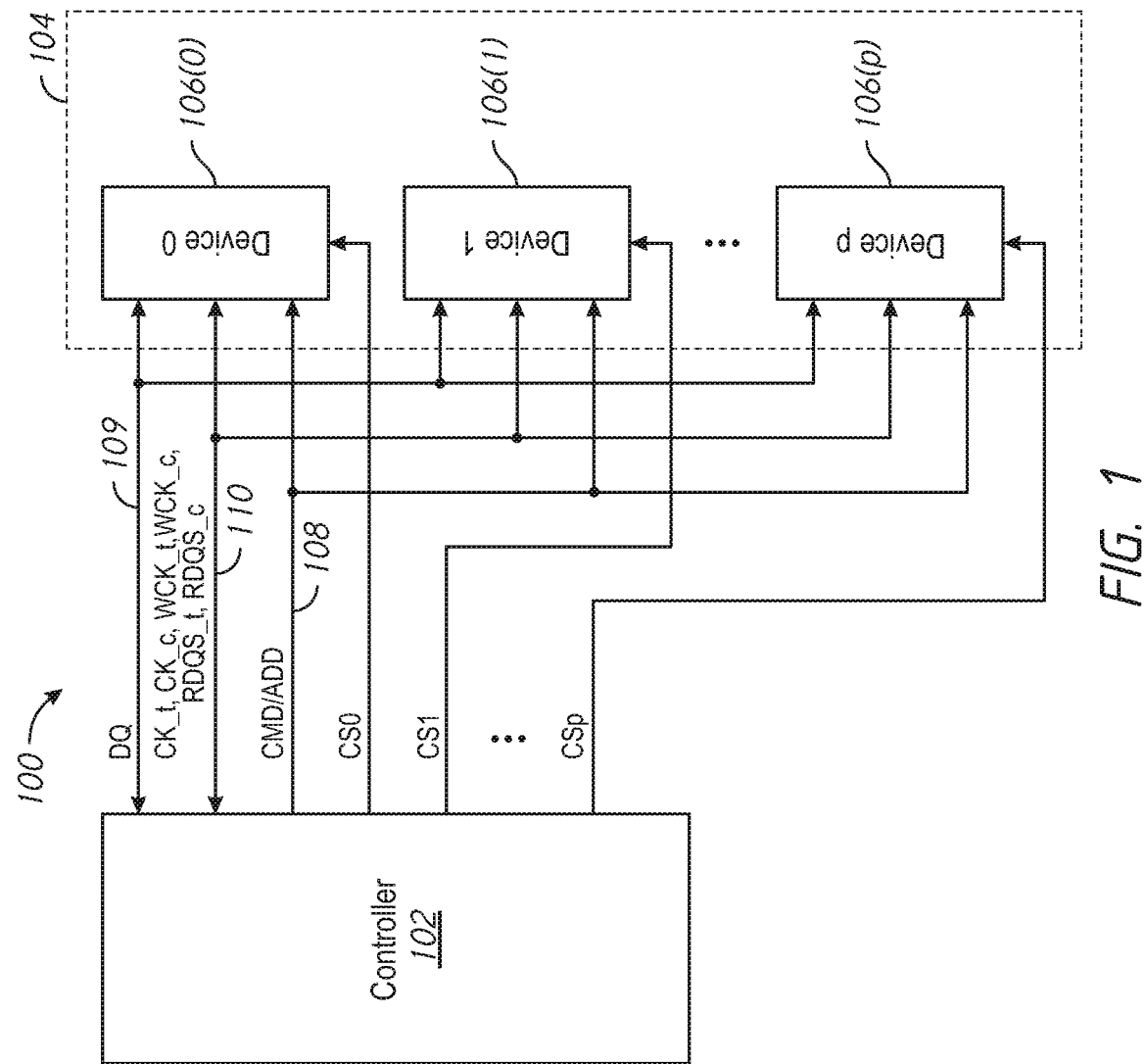
FIG. 1 is a block diagram of a system according to an embodiment of the present disclosure.

A semiconductor device, such as a semiconductor memory device, may use clock signals to synchronize the operation of one or more components. Since precise timing of the components may be required for reliable operation of the memory, the memory may monitor and adjust the clock signal in order to ensure that it matches an expected value such as a target duty cycle (e.g., 50%) or that it falls within a tolerance of the expected value (e.g., within +/−5% of 50%). When the memory is initialized (e.g., when the device is powered on), the memory device may determine a duty cycle of the clock signal, and may determine an amount to adjust the duty cycle of the clock signal in order to match a target duty cycle (e.g., 50%). The adjustment may be determined as part of a training process during the initialization. The training process may involve testing a sequence of different possible adjustments to the duty cycle and determining if each adjustment is better or worse (e.g., closer or further away from a target duty cycle) than the current adjustment. Since the training process can include adjusting the duty cycle over time, it may be unsuitable for use while the device is in operation (e.g., performing access operations such as read/write).

The adjustment may be stored (e.g., in a mode register of the device) as a duty code. The duty code may be a range of values (e.g., −7 to 7) which may each correspond with a different level of adjustment to the clock signal. Although the device is initialized such that the duty cycle of the clock signal is adjusted to match a target duty cycle, over time the duty cycle of the clock signal may shift and the initial duty code may no longer achieve the target duty cycle. The process of determining the duty code on initialization may be a lengthy one, which may make it unsuitable for use while the memory is performing access operations (e.g., carrying out read and/or write operations).

The present disclosure thus describes apparatuses and methods for a multi-bit duty cycle monitor (DCM). The duty cycle monitor may be coupled to the clock signal in the memory and may measure a duty cycle of the clock signal. The DCM may provide a signal which consists of multiple bits of information. The multi-bit DCM may provide information about adjusting the duty cycle based on the duty cycle of the received clock signal. Instead of testing out different adjustments to the clock and determining if they are better or worse than the current adjustment of the clock signal (e.g., the current duty code), the multi-bit DCM may allow the memory to determine or select an adjustment based on internal limits (e.g., tolerances) of the multi-bit DCM based on the current clock signal itself. Since the multi-bit DCM can determine needed adjustments based on the clock signal without the need for adjustment, the multi-bit DCM may determine adjustments while the memory device is in operation (e.g., performing access operations).

For each received period (or group of periods) of the clock cycle, the multi-bit DCM may compare the duty cycle of the received period of the clock signal to a range of tolerances about a target duty cycle value (e.g., 50%). The multi-bit DCM may provide a signal which indicates if the current duty cycle of the clock signal is within an upper and lower tolerance about a target duty cycle, if the current duty cycle is above the upper tolerance, or if the current duty cycle is below the lower tolerance. The values of the tolerances may be inherent to the multi-bit DCM (e.g., based on circuit properties) and/or may be programmable values. In some embodiments, the multi-bit DCM may continuously (e.g., as fast as possible) provide the signal indicating if adjustments are needed to the duty code.

The memory may adjust the duty code responsive to this information. If the DCM indicates that the duty cycle is above the upper tolerance, then the duty code may be adjusted down. If the DCM indicates that the duty cycle is below the lower tolerance, then the duty code may be adjusted up. If the DCM indicates that the duty cycle is within the upper and lower tolerances, than the duty code may remain unchanged. In this manner, the adjusted clock signal may be monitored, and adjustments to the duty code may be determined while access operations (e.g., read and/or write operations) are occurring.

Although the present disclosure is described with respect to a semiconductor memory device as a specific example, it is to be understood by one of skill in the art that the present disclosure may be used with the clock signals of any semiconductor device.

FIG. 1 is a block diagram of a system 100 according to an embodiment of the disclosure. The system 100 includes a controller 102 and a memory system 104. The memory system 104 includes memories 106(0)-106(p) (e.g., "Device 0" through "Device p"), where p is a non-zero whole number. The memories 106 may be dynamic random access memory (DRAM), such as low power double data rate (LPDDR) DRAM in some embodiments of the disclosure. The memories 106(0)-106(p) are each coupled to the command/address, data, and clock busses. The controller 102 and the memory system 104 are in communication over several busses. For example, commands and addresses are received by the memory system 104 on a command/address bus 108, and data is provided between the controller 102 and the memory system 104 over a data bus 109. Various clock signals may be provided between the controller and memory system 104 over a clock bus 110. The clock bus 110 may include signal lines for providing system clock signals CK_t and CK_c received by the memory system 104, data clock WCK_t and WCK_c received by the memory system 104, and access data clock signals RDQS_t and RDQS_c provided by the memory system 104 to the controller 102. Each of the busses may include one or more signal lines on which signals are provided.

The CK_t and CK_c clock signals provided by the controller 102 to the memory system 104 are used for timing the provision and receipt of the commands and addresses. The WCK_t and WCK_c clock signals and the RDQS_t and RDQS_c clock signals are used for timing the provision of data. The CK_t and CK_c clock signals are complementary, the WCK_t and WCK_c clock signals are complementary, and the RDQS_t and RDQS_c clock signals are complementary. Clock signals are complementary when a rising edge of a first clock signal occurs at the same time as a falling edge of a second clock signal, and when a rising edge of the second clock signal occurs at the same time as a falling edge of the first clock signal. The WCK_t and WCK_c clock signals provided by the controller 102 to the memory system 104 may be synchronized to the CK_t and CK_c clock signals also provided by the controller 102 to the memory system 104. Additionally, the WCK_t and WCK_c clock signals may have a higher clock frequency than the CK_t and CK_c clock signals. For example, in some embodiments of the disclosure, the WCK_t and WCK_c clock signals have a clock frequency that is four times the clock frequency of the CK_t and CK_c clock signals.

The controller 102 provides commands to the memory system 104 to perform memory operations. Non-limiting examples of memory commands include timing commands for controlling the timing of various operations, access commands for accessing the memory, such as read commands for performing read operations and write commands for performing write operations, mode register write and read commands for performing mode register write and read operations, as well as other commands and operations. The command signals provided by the controller 102 to the memory system 104 further include select signals (e.g., chip select CS signals CS0, CS1, CSp). While all of the memories 106 are provided the commands, addresses, data, and clock signals, the select signals provided on respective select signal lines are used to select which of the memories 106 will respond to the command and perform the corresponding operation. In some embodiments of the disclosure, a respective select signal is provided to each memory 106 of the memory system 104. The controller 102 provides an active select signal to select the corresponding memory 106. While the respective select signal is active, the corresponding memory 106 is selected to receive the commands and addresses provided on the command/address bus 108.

In operation, when a read command and associated address are provided by the controller 102 to the memory system 104, the memory 106 selected by the select signals receives the read command and associated address, and performs a read operation to provide the controller 102 with read data from a memory location corresponding to the associated address. The read data is provided by the selected memory 106 to the controller 102 according to a timing relative to receipt of the read command.

In preparation of the selected memory 106 providing the read data to the controller 102, the controller provides active WCK_t and WCK_c clock signals to the memory system 104. The WCK_t and WCK_c clock signals may be used by the selected memory 106 to generate an access data clock signals RDQS_t and RDQS_c. A clock signal is active when the clock signal transitions between low and high clock levels periodically. Conversely, a clock signal is inactive when the clock signal maintains a constant clock level and does not transition periodically. The RDQS_t and RDQS_c clock signals are provided by the memory 106 performing the read operation to the controller 10 for timing the provision of read data to the controller 102. The controller 102 may use the RDQS_t and RDQS_c clock signals for receiving the read data.

In operation, when a write command and associated address are provided by the controller 102 to the memory system 104, the memory 106 selected by the select signals receives the write command and associated address, and performs a write operation to write data from the controller 102 to a memory location corresponding to the associated address. The write data is provided to the selected memory 106 by the controller 102 according to a timing relative to receipt of the write command.

In preparation of the selected memory 106 receiving the write data from the controller 102, the controller provides active WCK_t and WCK_c clock signals to the memory system 104. The WCK_t and WCK_c clock signals may be used by the selected memory 106 to generate internal clock signals for timing the operation of circuits to receive the write data. The data is provided by the controller 102 and the selected memory 106 receives the write data according to the WCK_t and WCK_c clock signals, which is written to memory corresponding to the memory addresses.

Each of the memories 106(0) to 106(p) may have a mode register, which may store one or more values related to the operation of that memory 106. The values may be stored in different registers of the mode register, and may be used to store memory settings, for example, enable signals, measurements, feedback, and/or other information related to the operation of the memory 106. The controller 102 may access data in a particular register through a mode register read (MRR) operation, and may write data to a register in a mode register write (MRW) operation. In one example, the clock signals WCK_t and WCK_c may need to be adjusted within one or more of the memories 106. As described herein, the memory 106 may monitor the clock signals WCK_t and WCK_c and store information about needed adjustments to the clock signal in a mode register. The controller 102 may retrieve this information via a MRR operation, and may determine an amount by which the clock signals should be adjusted. This adjustment value may then be written to a register of the mode register via a MRW operation. The adjustment value may act as a setting for a clock adjustment circuit of the memory 106. In another example, the process of monitoring and adjusting the clock circuit may be automatic on the memory 106, and the controller 102 may change the value of an enable register of the mode register in order to activate the process.

Figure 2:
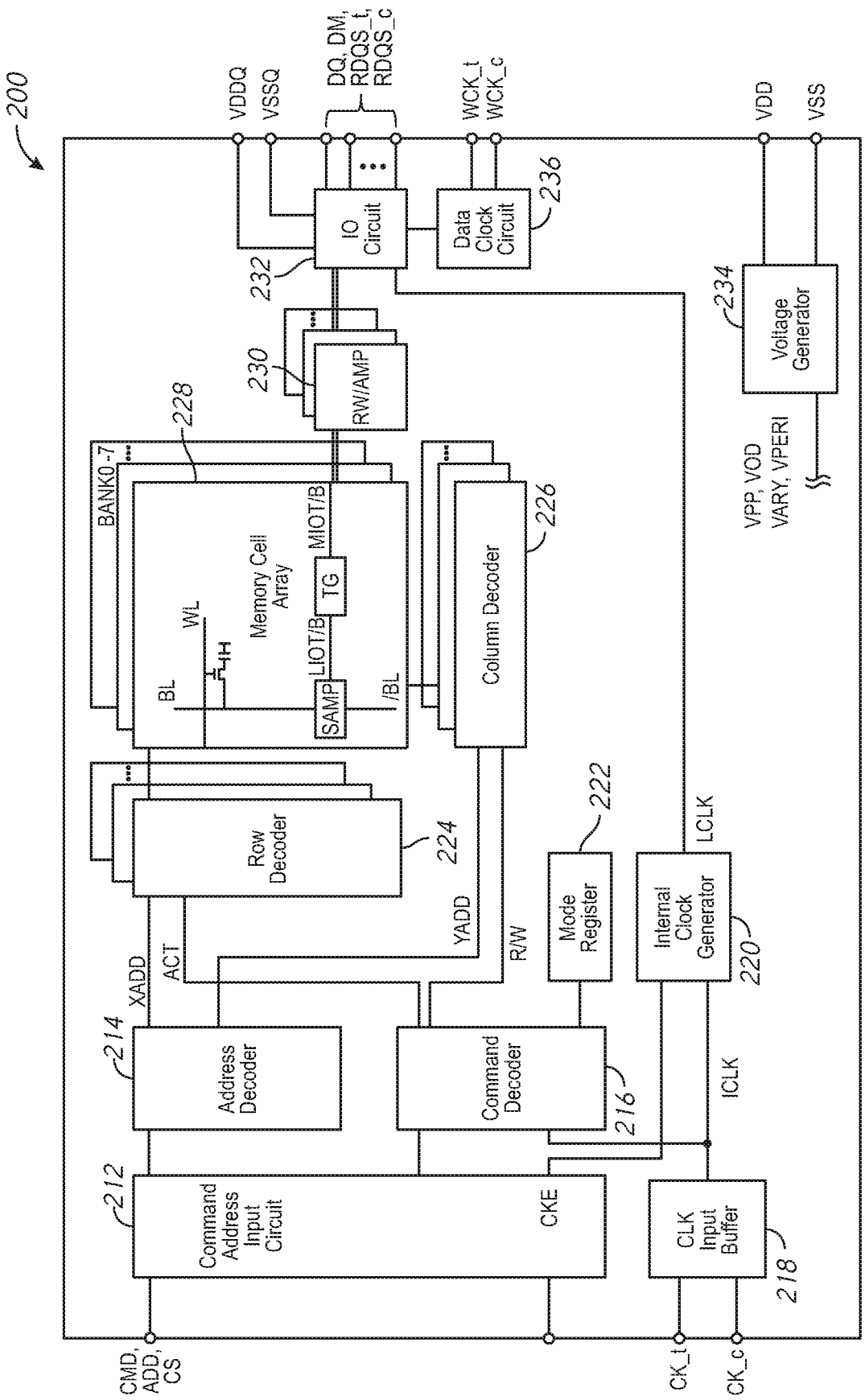
FIG. 2 is a block diagram of a semiconductor device according to an embodiment of the present disclosure.

FIG. 2 is a block diagram of an apparatus according to an embodiment of the disclosure. The apparatus may be a semiconductor memory 200, and will be referred to as such. In some embodiments, the memory 200 may include, without limitation, a DRAM device, such as low power DDR (LPDDR) memory integrated into a single semiconductor chip, for example. In some embodiments, the memory 200 may be an implementation of one or more of the memories 106 of FIG. 1.

The memory 200 includes a memory array 228. The memory array 228 is shown as including a plurality of memory banks. In the embodiment of FIG. 2, the memory array 228 is shown as including eight memory banks BANK0-BANK7. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder 224 and the selection of the bit lines BL and/BL is performed by a column decoder 226. In the embodiment of FIG. 2, the row decoder 224 includes a respective row decoder for each memory bank and the column decoder 226 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 230 over complementary local data lines (LIOT/B), transfer gate (TG), and complementary main data lines (MIOT/B). Conversely, write data outputted from the read/write amplifiers 230 is transferred to the sense amplifier SAMP over the complementary main data lines MIOT/B, the transfer gate TG, and the complementary local data lines LIOT/B, and written in the memory cell MC coupled to the bit line BL or /BL.

The memory 200 may employ a plurality of external terminals that include command and address and chip select (CA/CS) terminals coupled to a command and address bus to receive commands and addresses, and a CS signal, clock terminals to receive clock signals CK_t and CK_c, and data clock signals WCK_t and WCK_c, and to provide access data clock signals RDQS_t and RDQS_c, data terminals DQ and DM, and power supply terminals to receive power supply potentials VDD, VSS, VDDQ, and VSSQ.

The clock terminals are supplied with external clock signals CK_t and CK_c that are provided to an input buffer 218. The external clock signals may be complementary. The input buffer 218 generates an internal clock ICLK based on the CK_t and CK_c clock signals. The ICLK clock is provided to the command decoder 216 and to an internal clock generator 220. The internal clock generator 220 provides various internal clock signals LCLK based on the ICLK clock. The LCLK clock signals may be used for timing operation of various internal circuits. Data clock signals WCK_t and WCK_c are also provided to the external clock terminals. The WCK_t and WCK_c clock signals are provided to a data clock circuit 236, which generates internal data clock signals based on the WCK_t and WCK_c clock signals. The internal data clock signals are provided to the input/output circuit 232 to time operation of circuits included in the input/output circuit 232, for example, to data receivers to time the receipt of write data.

The data clock circuit 236 may monitor and/or adjust properties of the WCK_t and WCK_c clock signals before distributing them to other components of the memory and/or generated internal data clock signals based on the WCK_t and WCK_c clock signals. The data clock circuit 236 may adjust the WCK_t and WCK_c clock signals by an amount stored as a Duty code in a register of the mode register 222. The value of the Duty code may be set to an initial value during an initialization of the memory 200 before the memory 200 begins operating (e.g., on power-up). During operation (e.g., while access operations such as read and/or write operations are occurring) the data clock circuit 236 may monitor the duty cycle of the clock signal. A multi-bit duty result signal may be generated based on a current state of the duty cycle. The multi-bit duty result signal may be generated based on a comparison of the current duty cycle of the clock signal to upper and lower thresholds (e.g., upper and lower tolerances). The state of the bits of the duty result signal may indicate if the current duty cycle is below a lower threshold, above an upper threshold, or between the upper and lower threshold. The bits of the duty result signal may be stored in the mode register 222. The value of the Duty code may be periodically adjusted based on the value of the duty result stored in the mode register 222. In this manner, the clock signal may be adjusted to keep the duty cycle between the upper and lower thresholds.

The CA/CS terminals may be supplied with memory addresses. The memory addresses supplied to the CA/CS terminals are transferred, via a command/address input circuit 212, to an address decoder 214. The address decoder 214 receives the address and supplies a decoded row address XADD to the row decoder 224 and supplies a decoded column address YADD to the column decoder 226. The CA/CS terminals may be supplied with commands. Examples of commands include timing commands for controlling the timing of various operations, access commands for accessing the memory, such as read commands for performing read operations and write commands for performing write operations, mode register write and read commands for performing mode register write and read operations, as well as other commands and operations.

The commands may be provided as internal command signals to a command decoder 216 via the command/address input circuit 212. The command decoder 216 includes circuits to decode the internal command signals to generate various internal signals and commands for performing operations. For example, the command decoder 216 may provide a row command signal ACT to select a word line and a column command signal R/W to select a bit line.

The command decoder 216 may access mode registers 222 that are programmed with information for setting various modes and features of operation for the memory 200. For example, the mode registers 222 may be programmed with information for modes related to monitoring internal data clock signals that are generated by the data clock circuit 236 based on the WCK_t and WCK_c clock signals, as well as information for modes related to changing a timing of the internal data clock signals, such as the duty cycle of the internal data clock signals. The internal data clock signals may be monitored, for example, for duty cycle distortion caused by circuits of the data clock circuit 236, and the timing of the data clock signals may be adjusted to compensate for duty cycle error, for example, caused by the circuits of the data clock circuits 236. Example information that may be stored in the mode register 222 includes enable information used to activate one or more components of the data clock circuit 236, the duty code value used to adjust the duty cycle of WCK_t and WCK_c, and/or other signals related to duty cycle monitoring and/or adjustment.

The information in the mode registers 222 may be programmed by providing the memory 200 a mode register write (MRW) command, which causes the memory 200 to perform a mode register write operation. The command decoder 216 accesses the mode registers 222, and based on the programmed information along with the internal command signals provides the internal signals to control the circuits of the memory 200 accordingly. Information programmed in the mode registers 222 may be externally provided by the memory 200 using a mode register read (MRR) command, which causes the memory 200 to access the mode registers 222 and provide the programmed information.

When a read command is received, and a row address and a column address are timely supplied with the read command, read data is read from memory cells in the memory array 228 corresponding to the row address and column address. The read command is received by the command decoder 216, which provides internal commands so that read data from the memory array 228 is provided to the read/write amplifiers 230. The read data is output to outside from the data terminals DQ via the input/output circuit 232. The RDQS_t and RDQS_c clock signals are provided externally from clock terminals for timing provision of the read data by the input/output circuit 232. The external terminals DQ include several separate terminals, each providing a bit of data synchronized with a clock edge of the RDQS_t and RDQS_c clock signals. The number of external terminals DQ corresponds a data width, that is, a number of bits of data concurrently provided with a clock edge of the RDQS_t and RDQS_c clock signals. In some embodiments of the disclosure, the data width of the memory 200 is 8 bits. In other embodiments of the disclosure, the data width of the memory 200 is 16 bits, with the 16 bits separated into a lower byte of data (including 8 bits) and a upper byte of data (including 8 bits).

When the write command is received, and a row address and a column address are timely supplied with the write command, write data supplied to the data terminals DQ is written to a memory cells in the memory array 228 corresponding to the row address and column address. A data mask may be provided to the data terminals DM to mask portions of the data when written to memory. The write command is received by the command decoder 216, which provides internal commands so that the write data is received by data receivers in the input/output circuit 232. WCK_t and WCK_c clock signals are also provided to the external clock terminals for timing the receipt of the write data by the data receivers of the input/output circuit 232. The write data is supplied via the input/output circuit 232 to the read/write amplifiers 230, and by the read/write amplifiers 230 to the memory array 228 to be written into the memory cell MC. As previously described, the external terminals DQ include several separate terminals. With reference to a write operation, each external terminal DQ receives a bit of data, and the number of external terminals DQ corresponds to a data width of bits of data that are concurrently received synchronized with a clock edge of the WCK_t and WCK_c clock signals. Some embodiments of the disclosure include a data width of 8 bits. In other embodiments of the disclosure, the data width is 16 bits, with the 16 bits separated into a lower byte of 8 bits of data and an upper byte of 8 bits of data.

The power supply terminals are supplied with power supply potentials VDD and VSS. The power supply potentials VDD and VSS are supplied to an internal voltage generator circuit 234. The internal voltage generator circuit 234 generates various internal potentials VPP, VOD, VARY, VPERI, and the like based on the power supply potentials VDD and VSS supplied to the power supply terminals. The internal potential VPP is mainly used in the row decoder 224, the internal potentials VOD and VARY are mainly used in the sense amplifiers SAMP included in the memory array 228, and the internal potential VPERI is used in many peripheral circuit blocks.

The power supply terminals are also supplied with power supply potentials VDDQ and VSSQ. The power supply potentials VDDQ and VSSQ are supplied to the input/output circuit 232. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 232 so that power supply noise generated by the input/output circuit 232 does not propagate to the other circuit blocks.

Figure 3:
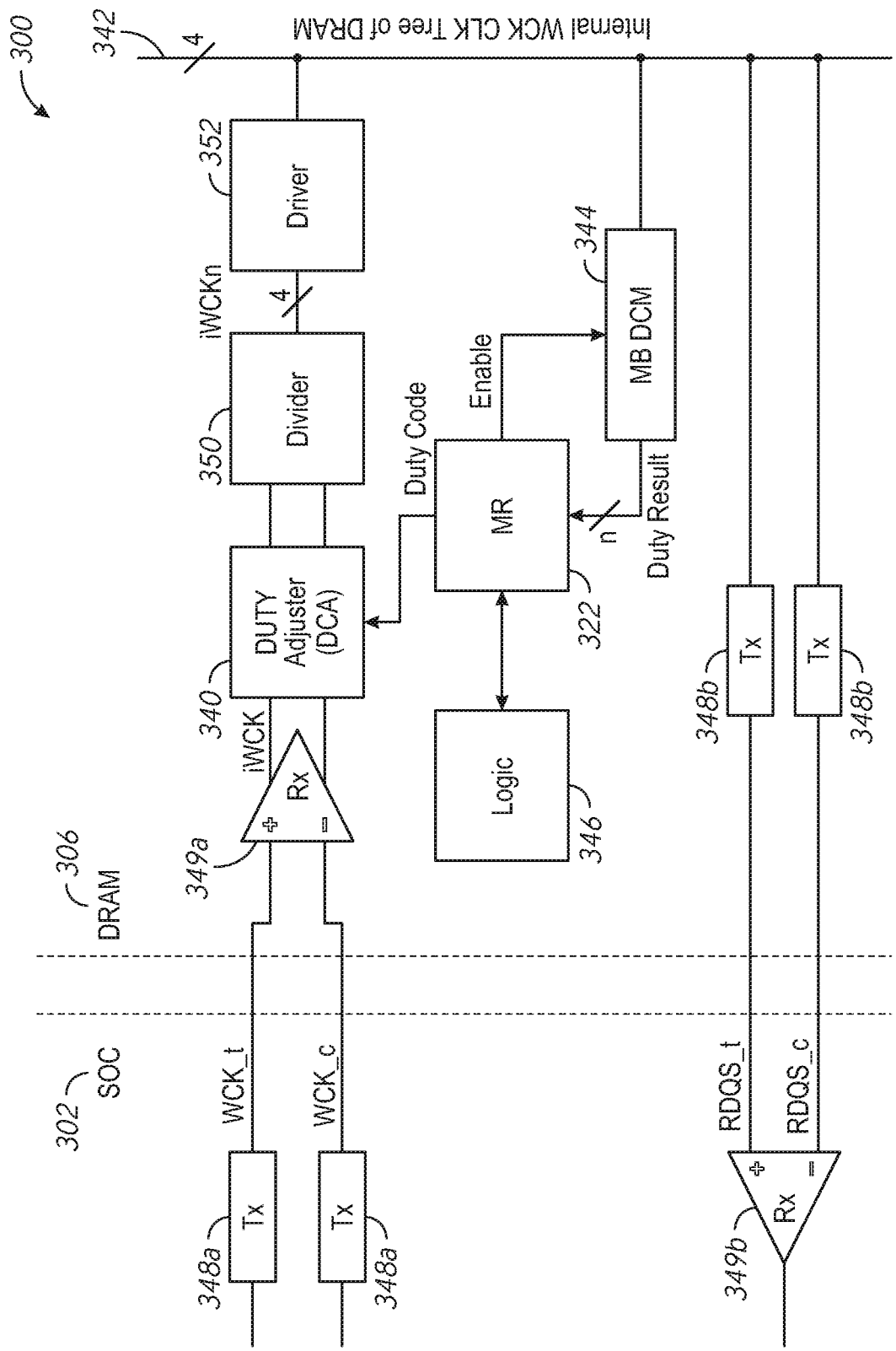
FIG. 3 is a block diagram of a clock signal path according to an embodiment of the present disclosure.

FIG. 3 is a block diagram of a clock signal path 300 according to an embodiment of the present disclosure. The clock signal path 300 may be implemented on the memory 200 of FIG. 2 in some embodiments. The clock signal path 300 may be included in a memory 306, which may be the memory 200 of FIG. 2 and/or the memory 106 of FIG. 1 in some embodiments. In some embodiments, one or more components of the duty cycle path 300 may be implemented in the data clock circuit 236 of FIG. 2. The clock signal path 300 may include a multi-bit duty cycle monitor (MB DCM) 344, which may monitor the duty cycle of the clock signal and a duty cycle adjustor (DCA) 340, which may adjust the duty cycle of the clock signal. The MB DCM 344 may determine adjustments to the duty cycle without the need to test different possible adjustments to the duty cycle (e.g., as in the initialization process). The MB DCM 344 may determine adjustments to the duty cycle while the memory 306 is carrying out access operations (e.g., read and write operations).

The system 302 provides clock signals WCK_t and WCK_c with transmitters 348a to a memory 306. The clock signals WCK_t and WCK_c are provided to a receiver 349a, which provides internal clock signals iWCK for the memory 306. There may be two internal clock signals iWCK (e.g., one corresponding to each of WCK_t and WCK_c). In some embodiments, the two clock signals iWCK may be complementary to each other. For the sake of clarity, except in situations where they undergo separate operations or couplings, iWCK may be generally used to describe of or more of the clock signals. The receiver 349a provides the iWCK clock signals to the DCA 340 which adjusts the clock signals iWCK based on the value of a duty code which may be stored in one or more registers of a mode register 322.

The duty cycle adjustor 340 provides the adjusted clock signal to a divider 350, which may generate one or more additional clock signals iWCKn based on the adjusted clock signals. Since the iWCKn clock signals are based on the adjusted clock signals from the DCA 340, the iWCKn clock signals may also be considered to be adjusted clock signals. There may be plurality of different clock signals iWCKn, which may be denoted by the value of 'n' (e.g., iWCK1, iWCK2, etc.). As shown in the example of FIG. 3, there may be four clock signals iWCKn, each of which may have a phase which is offset by 90° from the other neighboring clock signals provided by the divider 350 (e.g., iWCK1 may be 90° ahead of iWCK2, and 90° behind iWCK4). In some embodiments of the disclosure, there may be two pairs of complementary iWCKn clock signals (e.g., iWCK1 and iWCK3 are complementary and iWCK2 and iWCK4 are complementary). The divider 350 provides the iWCKn clock signals to the driver 352, which may modify one or more characteristics of the iWCKn clock signals (e.g., may increase their voltage and/or current).

The driver 352 provides the iWCKn clock signals to a WCK clock tree 342, which in turn may provide the adjusted clock signals iWCKn to one or more components of the memory 306, such as a RDQS clock path including transmitters 348b. The WCK clock tree 342 may be a network of conductive elements which distribute the WCK clock signals to one or more components of the memory 306. The transmitters 348b may be used to provide the RDQS clock signal (based on the iWCKn clock signals) back to the system 302 via receiver 349b. The WCK clock tree 342 also provides one or more of the iWCKn clock signals to the MB DCM 344.

The MB DCM 344 may be coupled to the mode register 322. The MB DCM 344 may be activated based on the value of an enable information which may be stored in one or more registers of the mode register 322. While active, the MB DCM 344 may measure the duty cycle of the iWCKn clock signal(s) provided by the WCK clock tree 342. The MB DCM 344 may compare the current duty cycle of the clock signal to internal tolerances (e.g., thresholds) and determine if the duty cycle of the clock signal needs adjustment, based on the current value of the duty cycle of the clock signal while it is being used to time access operations. The MB DCM 344 may then provide a multi-bit duty result signal based on this comparison, the values of which may be written to one or more registers of the mode register 322. In FIG. 3, the duty result value is represented by a multi-bit signal with n bits. In some embodiments, n may be 2. In other embodiments, n may be a greater number of bits. Each of the bits may have a value (e.g., a logical high or a logical low), and the duty result may have a state based on the values of each of the bits.

In some embodiments, the bits of the duty result signal may be provided simultaneously along a number of conductive paths corresponding to the number of bits (e.g., in parallel). In some embodiments, the bits of the duty result signal may be provided along a number of conductive paths less than the number of bits, and the bits may be provided sequentially (e.g., in series).

The value(s) of the duty result signal may be written into one or more registers of the mode register 322. In some embodiments, a current value of the duty result signal may overwrite the previously stored values in the mode register 322. The state of the duty result may consist of multiple bits of information. By using multiple bits, the MB DCM 344 may be able to indicate more information than just if the current duty cycle matches a target duty cycle value or not. For example, the MB DCM 344 may provide a duty result signal which indicates if the current duty cycle is higher than, lower than, or equal to a target duty cycle.

The mode register 322 is coupled to logic 346, which monitors the values of registers of the mode register 322, and updates one or more registers of the mode registers 322 responsive to the values of the monitored registers (e.g., responsive to the state of the duty result signal). In particular, the logic 346 may adjust the value of the duty code based on the state of the duty result as described in more detail below. In some example embodiments, a first state of the duty result may indicate that the duty code should be increased, while a second state of the duty result may indicate that the duty code should be decreased. A third state of the duty result indicates that the duty code should be kept at its current value.

The DCA 340 may adjust the duty cycle(s) of the iWCK clock signals responsive to the value of a duty code stored in the mode register 322. For example, he DCA 340 may apply a time delay to one or both of the iWCK clock signals in order to prolong or shorten the time that the iWCK clock signal spends in a high logical state. The duty code may be a numerical value (e.g., an integer value) which represents an adjustment of the duty cycles. The DCA 340 may translate the value of the duty code into the actual delay time applied to the iWCK clock. The adjustment times used by the DCA 340 may be non-linear or linear compared to the value of the duty code. In some embodiments, the duty code may have both positive and negative values, where the positive values may indicate increasing the time the signal is in a high logical state, while the negative values may indicate decreasing the time the signal is in a high logical state. The duty code may be a numerical value (e.g., from −7 to +7). In some embodiments, the duty code may only have values of one polarity (e.g., positive), but the adjustments may still include both increasing and decreasing the time the clock signals is in a high logical state.

The MB DCM 344 may receive the iWCKn clock signals from the WCK clock tree 342. The iWCKn clock signals may reflect the adjustment that the DCA 340 applied to the iWCK clock signals. The MB DCM 344 may measure the duty cycle of the received iWCKn clock signals, and may provide a duty result signal to the mode register 322. In some embodiments, the MB DCM 344 may be coupled to only some of the iWCKn clock signals from the WCK clock tree 342. For example, the MB DCM 344 may be coupled to a complementary pair of the iWCKn clock signals (e.g., iWCK1 and iWCK3).

The MB DCM 344 may selectively operate in response to the value of the enable information stored in the mode register 322. For example, when the enable information is at a low logical value, the MB DCM 344 may be inactive, and may not provide the duty result signal. When the enable signal at a high logical value, the MB DCM 344 may provide the duty result signal responsive to the iWCKn clock signals.

In some embodiments, the MB DCM 344 may have a tolerance of allowable deviations from the target duty cycle. The tolerance may be designed into the components of the MB DCM 344 and/or may be a programmable value (e.g., a value stored in the mode register 322). The tolerances may be expressed as a range of acceptable duty cycles which lie between an upper threshold (representing the maximum tolerance) and a lower threshold (representing the minimum tolerance). In an example operation, the MB DCM 344 may determine if the current duty cycle is between an upper threshold and a lower threshold (e.g., within +/−5% of 50%), if the current duty cycle is above the upper threshold, or if the current duty cycle is below the lower threshold. The MB DCM 344 may provide the duty result in a first state when the duty cycle is greater than the upper threshold, in a second state when the duty cycle is between the upper and lower threshold, and a third state when the duty cycle is below the lower threshold.

The logic 346 may be capable of reading and writing values in the mode register 322, as well as performing one or more operations based on the values of the mode register 322. In some embodiments, the logic 346 may be a component of the memory 306. In some embodiments, the logic 346 may be located off the memory 306. For example, the logic 346 may be located in the controller 102 of FIG. 1 or the system 302 of FIG. 3. In such embodiments of the disclosure, the logic 346 may use a mode register write (MRW) operation to change the value of the enable signal in the mode register 322 in order to start (or stop) the operation of the MB DCM 344. In some embodiments, the logic 346 may activate the MB DCM 344 periodically. In some embodiments, the logic 346 may activate the MB DCM 344 so that it runs continuously while the memory 306 is in operation.

When the logic 346 is located in a controller/system, the logic 346 may use mode register read (MRR) operations to determine the values of each bit of the duty result code stored in the mode register 322. Based on the state of the duty result, the logic 346 may then use a MRW operation to change the value of the duty code in the mode register 322. The state of the duty result may be updated while access operations (e.g., read and write operations) are occurring in the memory 306. In some embodiments, the MB DCM 344 may keep providing new states of the duty result signal to the mode register 322 continuously (e.g., as fast as possible) while access operations are occurring. The logic 346 may wait to update the value of the duty code until a break in access operations (e.g., read and write operations) in the memory 306. In some embodiments, the logic 346 may pause the operation of the memory 306 in order to update the duty code.

In an example operation, if the value of the duty code indicates that the duty cycle is below a lower tolerance, then the logic 346 may use a MRW to increment the value of the duty code (e.g., from +3 to +4). If the value of the duty code indicates that the duty cycle is above an upper tolerance, then the logic 346 may use an MRW operation to decrement the value of the duty code (e.g., from +3 to +2). If the duty code indicates that the duty cycle is between the upper and lower tolerances, then the logic 346 may leave the current value of the duty code unchanged. In this manner, the MB DCM 344 may monitor the duty cycle of the clock signal while the memory 306 is in operation (e.g., performing access operations), and the duty code may be updated responsive to that monitoring.

In some embodiments, there may be an upper and a lower data path. While for brevity only a single clock signal path 300 has been shown and discussed, it should be understood that in some embodiments certain components of the path 300 may be repeated for an upper and lower byte. For example, there may be an upper duty cycle adjuster (DCAU) and a lower duty cycle adjuster (DCAL) along with corresponding upper and lower MB DCMs.

In this manner, adjustments to the duty code may be determined without the need to adjust the duty cycle of the clock signals before determining the adjustment. The MB DCM 344 may determine an adjustment to the duty code based on the duty cycle of the current clock signal being provided along the WCK clock tree 342. The duty cycle is compared to upper and lower thresholds of the MB DCM 344 which may be, for example, programmable values of the MB DCM 344 and/or physical properties of one or more components of the MB DCM 344. Based on the comparison to the upper and lower thresholds, the MB DCM 344 may provide a duty result signal with a state that indicates an adjustment to the duty code of the clock signal in order to bring the duty code closer to being between the upper and lower thresholds.

Figure 4:
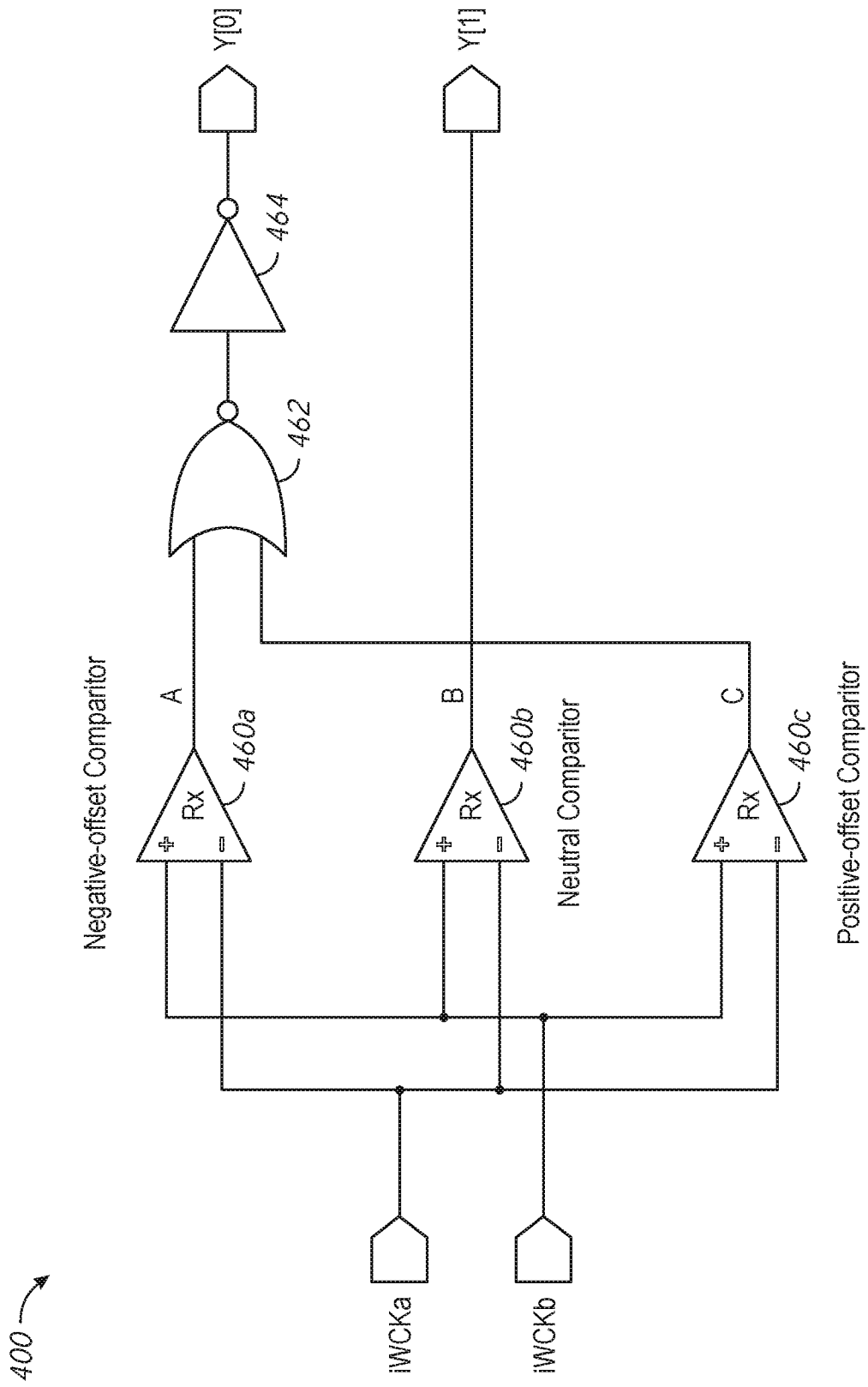
FIG. 4 is a schematic diagram of a multi-bit duty cycle monitor (DCM) according to an embodiment of the present disclosure.

FIG. 4 is a schematic diagram of a multi-bit duty cycle monitor (MB DCM) according to an embodiment of the present disclosure. In some embodiments, the MB DCM 400 may be an implementation of the MB DCM 344 of FIG. 3. The MB DCM 400 is a two-bit DCM, which receives clock signals iWCKa and iWCKb, and provides a duty result signal consisting of two bits, Y[0] and Y[1]. The clock signal iWCKa is coupled to the negative input (−) of each of three comparators 460a-c. The clock signal iWCKb is coupled to the positive input (+) of each of the three comparators 460a-c. The clock signals iWCKa and iWCKb may be provided by a WCK clock tree (e.g., WCK clock tree 342 of FIG. 3). The clock signals iWCKa and iWCKb may represent a pair of the clock signals iWCKn which are complementary to each other. The clock signals iWCKa and iWCKb may have been previously adjusted by a DCA (e.g., DCA 340 of FIG. 3).

The MB DCM 400 includes three comparators 460a-c each of which provides a result signal based on a comparison of the values of the input signals. The three comparators 460a-c may be coupled to one or more logic gates which may determine the values of the duty result signal based on the outputs of the comparators 460a-c. In the example of FIG. 4, the comparator 460b provides a signal B, which is the value of the output bit Y[1]. The comparators 460a and 460c provide outputs A and C respectively which are coupled to NOR gate 462. The NOR gate 462 is coupled to an inverter 464, which provides the output bit Y[0].

In general, the comparators 460a-c may provide a low logical value (e.g., a 0) when the value on the positive input (+) is less than a value of the negative input (−), and may provide a high logical value (e.g., a 1, a high voltage) when the value on the positive input (+) is greater than a value of the negative input (−). Each of the comparators 460a-c may have a different offset voltage between the positive and negative inputs. The offset voltage may be an inherent property of each of the comparators 460a-c and may be modeled as an additional voltage applied between the positive and negative inputs of each of the comparators 460a-c. In particular, in the MB DCM 400, the comparator 460a may have a negative offset, the comparator 460c may have a positive offset, and the comparator 460b may have a neutral offset (e.g., an offset voltage close to 0).

The magnitudes of the offsets of the comparators 460a and 460c may determine the upper and lower thresholds around the target duty cycle (e.g., the tolerances). In the example MB DCM 400, the target duty cycle is 50%. In some embodiments, the upper and lower tolerance may be the same amount relative to the target duty cycle (e.g., the upper tolerance may be the target duty cycle plus a tolerance value, while the lower tolerance may be the target duty cycle minus the tolerance value). In some embodiments, the upper and lower tolerances may be different. The offsets of the comparators 460a and 460c may be determined by the physical properties of the comparator circuits. In some embodiments, the amount of the offset of each of the comparators may need to be modeled and/or measured. In some embodiments, the upper and lower tolerances may be programmable values, which may be based on programmable offsets of the comparators 460a and 460c. The programmable offsets (and thus, the upper and lower thresholds) may be set based on values in the mode register (e.g., mode register 122 of FIG. 1).

The offset on the positive offset comparator 460c may represent the upper threshold. The offset on the negative offset comparator 460a may represent the lower threshold. The neutral offset of the neutral comparator 460b may represent the target duty cycle. Accordingly, if the comparator 460c returns a high logical level (indicating that iWCKb has a higher duty cycle than iWCKa plus the offset of the comparator 460c), then the signal provided by the MB DCM 400 may indicate that the duty cycle is above the upper threshold and needs to be reduced. Similarly, if the comparator 460a returns a low logical level (indicating that iWCKb has a lower duty cycle than iWCKa minus the offset of the comparator 460a), then the signal provided by the MB DCM 400 may indicate that the duty cycle is below the lower threshold and needs to be increased. If the comparator 460c returns a low logical level while the comparator 460a returns a high logical level, it may indicate that the clock signal has a duty cycle between the upper and lower thresholds.

The MB DCM 400 is a two-bit DCM and thus may have four different states. Each state may correspond to the relationship of the current duty cycle to the three comparators 460a-c. A first state may be when the duty cycle of the clock signals iWCKa and iWCKb are below the lower threshold, in which case all three of the outputs A, B, and C may be in a low logical state since the duty cycle is below a level that would cause any of the comparators 460a-c to provide a high logic level output. A second state may be when the duty cycle is above the lower threshold (as determined by the offset of the negative offset comparator 460a), but has a duty cycle of less than 50%. In the second state the output A may be a high logical level, but the outputs B and C may be low logical levels. In a third state, the duty cycle may be greater than 50% but less than the upper threshold (as determined by the offset of the positive offset comparator 460c). The outputs A and B may be at a high logical level, while the output C is at a low logical level. In a fourth state, the duty cycle may be greater than the upper threshold, and all three outputs A, B, and C may be at a high logical level.

The logic gates of the MB DCM 400 may provide a multi-bit duty result signal based on the states of the outputs A, B, and C. Since there are four possible states, the duty result signal of the MB DCM 400 may be expressed as a two-bit signal. Logic gates of the MB DCM 400 (e.g., NOR gate 462 and inverter 464) may be used to translate the states of A, B, and C into the two bits of the duty result signal. Other example multi-bit DCM's may have more than two bits, and thus may have more comparators and more states. For example, in some embodiments, more comparators may be used (e.g., to determine different levels that the duty cycle is above or below a target duty cycle) and thus, more bits may be used to represent the duty result signal.

In another example embodiment, one or more different logic gates may be used in place of NOR gate 462 and/or inverter 464 to achieve a particular desired result. Table 1 (below) shows a logic table for a modification of the MB DCM 400 of FIG. 4. The first three columns show the outputs of the three comparators 460a-c. The outputs may be represented as a 1 (for a high logical value) or a 0 (for a low logical value). Certain rows may be marked with an 'X' to represent scenarios where the value of the bit is determined by the given situation. For example, in a scenario where the output C is a '1', indicating that the duty cycle is above the upper threshold, then the outputs A and B will also be 1, since they switch to providing a high logic level at duty cycles below the upper threshold. Similarly, when the output A is at a low logic level (indicating that the duty cycle is below the lower threshold) then the outputs B and C will also be at a low logic level.

TABLE 1

Logic Table for Two-Bit DCM

| C | B | A | Y |
|---|---|---|---|
| X | X | 0 | 00 |
| X | 0 | 1 | 01 |
| 0 | 1 | X | 10 |
| 1 | X | X | 11 |

In a first example operation, the MB DCM 400 may receive a WCK clock with a duty cycle below the lower tolerances. All three of the comparators 460a-c will return a low logical value. In response, the MB DCM may provide a signal of 00. When the duty cycle is above the lower tolerance, but below 50%, the MB DCM may provide a signal of 01. When the duty cycle is above 50% but below the upper threshold, the MB DCM may provide a duty result signal of 10. When the duty cycle is above the upper tolerance, the MB DCM may provide a duty result signal of 11.

Logic coupled to the memory (e.g., logic 346 of FIG. 3 and/or controller 102 of FIG. 1) may adjust the value of the duty code responsive to the value of the duty result. For example, when the two bits of the duty result are different (e.g., 10 or 01), it may indicate that the duty code is between the upper and lower tolerances, and that no adjustment of the current duty code is required. When the two bits are the same, it may indicate that an adjustment is required. If the duty result is 00, then the duty code may be adjusted upwards, while if the duty result is 11, then the duty code may be adjusted downwards.

Figure 5:
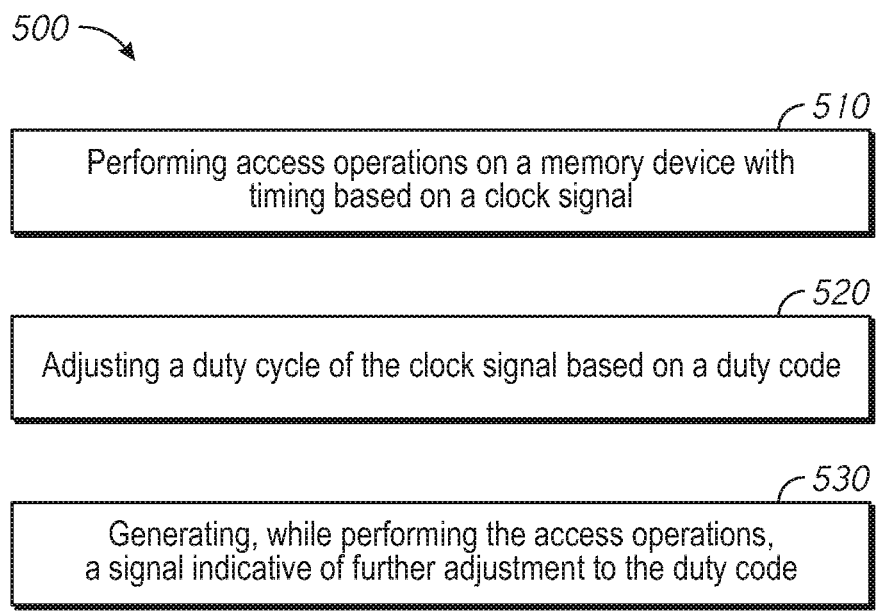
FIG. 5 is a flow chart depicting a method of adjusting a duty code according to an embodiment of the present disclosure.

FIG. 5 is a flow chart depicting a method of adjusting a duty code according to an embodiment of the present disclosure. In some embodiments, the method 500 may be implemented by one or more of the components described in FIGS. 1-4. The method 500 may generally begin with block 510, which describes performing access operations on a memory device with timing based on a clock signal. Block 510 may generally be followed by block 520, which describes adjusting a duty cycle of the clock signal based on a duty code. Block 520 may generally be followed by block 530 which describes generating, while performing the access operations, a signal indicative of further adjustments to the duty code.

Block 510 describes performing access operations on a memory device (e.g., memory 106 of FIG. 1, memory 200 of FIG. 2, and/or memory 306 of FIG. 3) with timing based on a clock signal. In some examples, the access operations may be read or write operations of the memory. The access operations may be synchronized to the clock signal (and/or to one or more signals based on the clock signal). The clock signal may switch between a high and low logic level, with a duty cycle based on the percentage of time the clock signal is at the high logic level.

Block 520 describes adjusting a duty cycle of the clock signal based on a duty code. The memory may include a duty cycle adjuster (e.g., DCA 340 of FIG. 3), which may adjust the duty cycle of the clock signal. The amount that the DCA adjusts the clock signal may be based on the value of a duty code, which may be stored in a mode register of the memory (e.g., mode register 322 of FIG. 3). The duty code may have a range of possible values, each of which may be associated with a different amount of adjustment to the duty cycle of the clock signal. When the memory is initialized (e.g., powered on) a training process may be used to determine an initial value to the duty code such that the DCA adjusts the duty cycle of the clock signal to match (or be close to) a target duty cycle.

Block 530 describes generating, while performing the access operations, a signal indicative of further adjustment to the duty code. The memory may include a duty cycle monitor (e.g., DCM 344 of FIG. 3), which may monitor the duty cycle of the clock signal. The duty cycle monitor may generate a duty result signal, which may be a multi-bit signal, which may indicate the current duty cycle of the clock signal. In particular the DCM may compare the current value of the duty cycle of the clock signal to an upper and lower threshold value about a target duty cycle. The duty result signal may be in a first state when the duty cycle is below the lower threshold, in a second state when the duty cycle is above the upper threshold, and in a third state when the duty cycle is between the upper and lower threshold. The value of the duty result signal (e.g., which state it's in) may be changed while the access operations are occurring.

Based on the current value (e.g., state) of the duty result signal, the value of the duty code may be changed. The value of the duty code may be increased when the duty result signal is in the first state. This may increase a duty cycle of the clock signal. The value of the duty code may be decreased when the duty result signal is in the second state. This may decrease a duty cycle of the clock signal. The value of the duty code may be kept the same when the duty result signal is in the third state. This may also keep the duty cycle of the clock signal the same. This process may be iterated, so that, for example, as long as the duty result signal indicates that the duty cycle of the clock signal is below the lower threshold (e.g., by being the first state), the value of the duty code will be increased with each iteration, until the duty result signal indicates that the duty cycle is between the upper and lower tolerances (e.g., changes to the third state). In this manner, adjustments to the duty code may be determined while the access operations are occurring.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

The description herein of certain embodiments is exemplary in nature and is in no way intended to limit the scope of the disclosure or its applications or uses. In the foregoing detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features may not be discussed when they would be apparent to those with skill in the art so as not to obscure the description of embodiments of the disclosure. The foregoing detailed description is therefore not to be taken in a limiting sense.

To reiterate, the above discussion is intended to be illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended scope of the present system as set forth in the claims that follow. Accordingly, the specification and drawings are to be regarded in an illustrative manner and are not intended to limit the scope of the appended claims.

What is claimed is:

1. An apparatus comprising:
a memory configured to perform access operations with timing based on a clock signal;
a duty cycle adjustor configured to adjust a duty cycle of the clock signal based on a duty code stored in a register; and
a duty cycle monitor coupled to the duty cycle adjustor and configured to provide a multi-bit signal based on the duty cycle of the clock signal, wherein the multi-bit signal is different than the duty code, wherein the multi-bit signal is in a first state if the duty cycle is less than a lower threshold, a second state if the duty cycle is greater than an upper threshold, and a third state if the duty cycle is between the upper threshold and the lower threshold, wherein the duty code is adjusted based on the state of the multi-bit signal and wherein the duty code is adjusted while the access operations of the memory are being performed.

2. The apparatus of claim 1, wherein the duty cycle monitor comprises a first comparator with a positive offset and a second comparator with a negative offset, wherein the upper threshold is based on the positive offset and wherein the lower threshold is based on the negative offset.

3. The apparatus of claim 1, wherein the multi-bit signal comprises a first bit and a second bit, wherein the first state and the second state comprise the first bit and the second bit being a same value, and wherein the third state comprises the first bit and the second bit being different values.

4. The apparatus of claim 1, wherein the upper threshold is greater than a target duty cycle and the lower threshold is below the target duty cycle.

5. The apparatus of claim 1, wherein the upper threshold and the lower threshold are programmable values.

6. The apparatus of claim 1, wherein the duty cycle adjustor is configured to adjust the duty cycle of the clock signal by an amount that is responsive to the multi-bit signal.

7. The apparatus of claim 1, wherein the duty cycle adjustor and the duty cycle monitor are components of the memory.

8. The apparatus of claim 1, wherein the duty cycle monitor is configured to provide the multi-bit signal while the access operations are being performed.

9. The apparatus of claim 1, further comprising a logic circuit configured to adjust the value of the duty code based on the state of the multi-bit signal.

10. The apparatus of claim 9, wherein the logic circuit is configured to increase the duty code responsive to the multi-bit signal in the first state, decrease the duty code responsive to the multi-bit signal in the second state, and not change the duty code responsive to the multi-bit signal in the third state.

11. The apparatus of claim 7, wherein the register is a mode register of the memory.

* * * * *